United States Patent
Hwang et al.

(10) Patent No.: US 8,922,013 B2
(45) Date of Patent: Dec. 30, 2014

(54) THROUGH VIA PACKAGE

(75) Inventors: How Yuan Hwang, Sitiawan (MY); Kah Wee Gan, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 319 days.

(21) Appl. No.: 13/291,788

(22) Filed: Nov. 8, 2011

(65) Prior Publication Data

US 2013/0113098 A1 May 9, 2013

(51) Int. Cl.
| *H01L 23/498* | (2006.01) |
| *H01L 23/31* | (2006.01) |
| *H01L 23/00* | (2006.01) |
| *H01L 21/48* | (2006.01) |
| *H01L 23/538* | (2006.01) |

(52) U.S. Cl.
CPC ...... *H01L 23/3171* (2013.01); *H01L 23/49827* (2013.01); *H01L 23/3121* (2013.01); *H01L 24/18* (2013.01); *H01L 21/4857* (2013.01); *H01L 23/5389* (2013.01); *H01L 23/3128* (2013.01); *H01L 23/49816* (2013.01); *H01L 2224/12105* (2013.01)
USPC ............ 257/738; 257/E21.499; 257/E21.502; 257/E23.069; 438/106; 438/127

(58) Field of Classification Search
CPC ................. H01L 21/4857; H01L 2224/12105; H01L 23/3121; H01L 23/3128; H01L 23/3171; H01L 23/49816; H01L 23/49827; H01L 23/5389; H01L 24/18
USPC ........... 257/738, E21.499, E21.502, E23.069; 438/106, 127
See application file for complete search history.

(56) References Cited

U.S. PATENT DOCUMENTS

| 7,419,851 | B2* | 9/2008 | Lin et al. ........................ | 438/107 |
| 7,453,140 | B1* | 11/2008 | Lin et al. ........................ | 257/673 |
| 8,202,763 | B2* | 6/2012 | Meyer et al. ................... | 438/108 |
| 2006/0145328 | A1* | 7/2006 | Hsu .............................. | 257/690 |
| 2007/0273049 | A1* | 11/2007 | Khan et al. ..................... | 257/787 |
| 2007/0290376 | A1* | 12/2007 | Zhao et al. ..................... | 257/787 |
| 2008/0006931 | A1* | 1/2008 | Oliver et al. ................... | 257/712 |
| 2010/0041180 | A1* | 2/2010 | Oliver et al. ................... | 438/109 |
| 2012/0211885 | A1* | 8/2012 | Choi et al. ..................... | 257/737 |
| 2013/0113098 | A1* | 5/2013 | Hwang et al. .................. | 257/738 |
| 2013/0119539 | A1* | 5/2013 | Hsiao et al. .................... | 257/738 |
| 2013/0185935 | A1* | 7/2013 | Eichelberger et al. .......... | 29/842 |
| 2013/0330922 | A1* | 12/2013 | Oliver et al. ................... | 438/613 |

\* cited by examiner

*Primary Examiner* — Stephen W Smoot
*Assistant Examiner* — Edward Chin
(74) *Attorney, Agent, or Firm* — Seed IP Law Group PLLC

(57) ABSTRACT

An integrated circuit package includes an integrated circuit die in a reconstituted substrate. The active side is processed then covered in molding compound while the inactive side is processed. The molding compound on the active side is then partially removed and solder balls are placed on the active side.

13 Claims, 7 Drawing Sheets

THROUGH VIA PACKAGE

BACKGROUND

1. Technical Field

The present disclosure relates to integrated circuit packages. In particular the present disclosure relates to integrated circuits formed in reconstituted wafers.

2. Description of the Related Art

Integrated circuits are used in a large variety of applications. Individual integrated circuits can take the form of voltage amplifiers, voltage regulators, digital signal processors, microcontrollers, wireless adapters, microprocessors, smart cards, and many other devices. Some integrated circuits have circuitry that performs many of these functions on a single chip.

Integrated circuits are installed in desk top computers, lap top computers, cell phones, MP3 players, automobiles, printers, scanners, wireless routers, and in nearly every other kind of electronic device. Integrated circuits are generally packaged in such a way that they can easily be installed in one of the above mentioned devices. Methods of packaging integrated circuits include the use of ball grid arrays (BGAs), pin grid arrays (PGAs), lead frames, and many other methods. The balls, pins, and leads of the various integrated circuit packages provide the electrical connections between the integrated circuit and the electronic device in which it is installed.

In many devices, individually packaged integrated circuits are stacked one on top of the another. This saves surface area in the electronic device but also leads to complications in electrically connecting the integrated circuits to each other and to the electronic device. In such devices the integrated circuit packages generally have electrical connections on a top surface and a bottom surface of the package. Conductive redistribution lines are formed on both an active side and an inactive side of the integrated circuit die and connected by a through via. However, processing the redistribution lines on the inactive side of the die can damage structures on the active side of the die.

BRIEF SUMMARY

One embodiment is a method for forming a through via integrated circuit package. The method includes forming conductive through vias in the integrated circuit package to electrically connect structures on an active side of an integrated circuit die to structures on an inactive side of the integrated circuit die. Contact pads are formed on the active side of the integrated circuit die. The method includes forming first conductive redistribution lines overlying the active side to electrically connect the contact pads to the through vias, placing first solder structures on the first redistribution lines, and covering the active side and the first solder structures in molding compound. The method includes forming second redistribution lines overlying the inactive side while the active side is covered in molding compound. One embodiment includes placing the integrated circuit die in a reconstituted substrate and forming the through vias in the reconstituted substrate. In one embodiment the molding compound is partially removed and second solder structures are placed on exposed portions of the first solder structures.

One embodiment is an integrated circuit package including an integrated circuit die having an active side and an inactive side. The integrated circuit package includes contact pads on the active side of the integrated circuit die and first conductive redistribution lines on the contact pads. Second conductive redistribution lines overlying the inactive side of the die. First solder balls are coupled to the first conductive redistribution lines. A first encapsulation layer covers the first conductive redistribution lines and the first solder balls. Second solder balls are coupled to the first solder balls. Through vias electrically connect the first conductive redistribution lines to the second conductive redistribution lines. In one embodiment the integrated circuit die is embedded in a reconstituted substrate. The through vias are located in the reconstituted substrate.

DETAILED DESCRIPTION

Figure 1A:
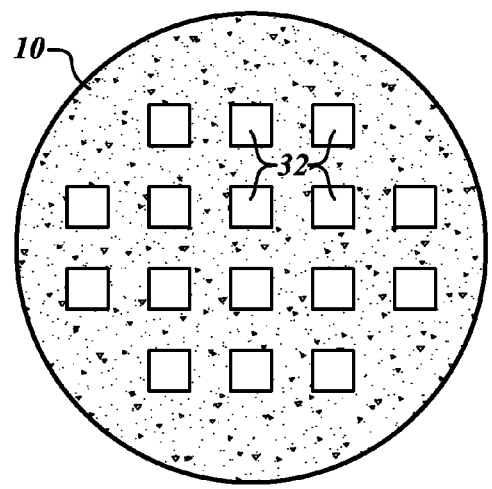
FIG. 1A shows a reconstituted wafer at one stage of process.

FIG. 1A shows a reconstituted wafer 10 that includes a plurality of semiconductor die 32. The methods of making such a reconstituted wafer 10 are well known in the art and are described in U.S. patent application Ser. Nos. 12/982,707, 13/098,083, 13/173,991. The remaining figures show steps related to the invention being carried out on what will become a single package that will be formed while it is part of the reconstituted wafer 10. The steps shown herein will usually be carried out on the wafer 10 as a whole, prior to separating into individual packages.

Figure 1B:
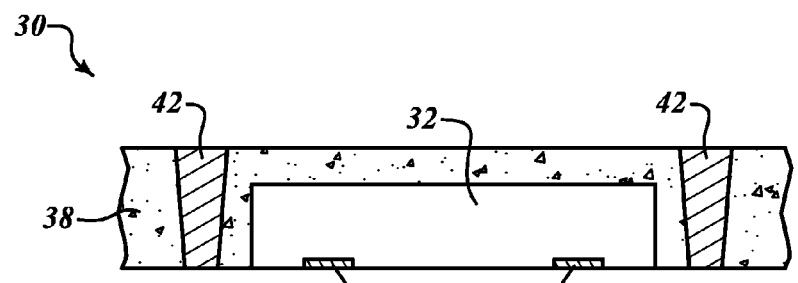
FIG. 1B illustrates a through via integrated circuit package at an intermediate stage of processing according to one embodiment according to one embodiment.

FIG. 1B illustrates a first step in the formation of an integrated circuit package 30 according to one embodiment. The integrated circuit package 30 includes an integrated circuit die 32 embedded in a reconstituted substrate 38. The reconstituted substrate 38 is a portion of the reconstituted wafer 10 shown in FIG. 1A. For ease of description and figures, the remaining text and figures will show the construction of one package 30 rather than the whole wafer 10 with the understanding that the steps are being carried out on the wafer 10 as a whole.

The integrated circuit die 32 includes contact pads 40 on an active side of the integrated circuit die 32. Through vias 42 are formed in the reconstituted substrate 38. The through vias 42 are filled with a conductive material.

The reconstituted substrate 38 is, for example, a molding compound including granular silica particles. The reconstituted substrate 38 laterally surrounds the integrated circuit die 32 and covers an inactive side of the integrated circuit die 32. The active side of the integrated circuit die 32, including contact pads 40, is not covered by the reconstituted substrate 38. The reconstituted substrate 38 is, for example, 700 μm thick. The reconstituted substrate 38 extends laterally from the integrated circuit die 32 allowing through vias 42 to be formed therein. Through vias 42 allow electrical connection of elements on the active side of the integrated circuit die 32 to elements on the inactive side of the integrated circuit die 32, which described below.

Forming through vias 42 in the reconstituted substrate 38 has several advantages. The reconstituted substrate 38 is relatively inexpensive to manufacture compared to the integrated circuit die 32. Thus, providing a reconstituted substrate 38 with a very large surface area is relatively inexpensive.

In some devices, through vias are formed in the integrated circuit die 32 instead of the reconstituted substrate 38.

The through vias 42, whether in the die 32 or substrate 38, are filled completely with a copper paste. Alternatively, the through vias 42 may be filled with copper formed in an electroless or electroplating process. The copper formed in electroless or electroplating process can include one or more layers including a seed layer of copper or tungsten, and an electroless layer of copper, as well an electroplated layer of copper. Any suitable materials may be used to form the conductive material filling the through via 42 as well as the reconstituted substrate 38.

The integrated circuit package 30 is described as having an active side and an inactive side. This refers to the fact that the integrated circuit die 32 will generally only have transistors formed on a single surface of the integrated circuit die 32. The surface of the integrated circuit die 32, including the transistors, is generally referred to as the active side of the integrated circuit die 32. It is also called the front face, top face, or other terms. The surface opposite the contact pads 40 is generally called the inactive side of the integrated circuit die 32. It is also called the backside, bottom, or other terms. Therefore the active side of the integrated circuit package 30 is corresponds to the active side of the integrated circuit die 32. The inactive side of the integrated circuit package 30 corresponds to the inactive side of the integrated circuit die 32.

Figure 1C:
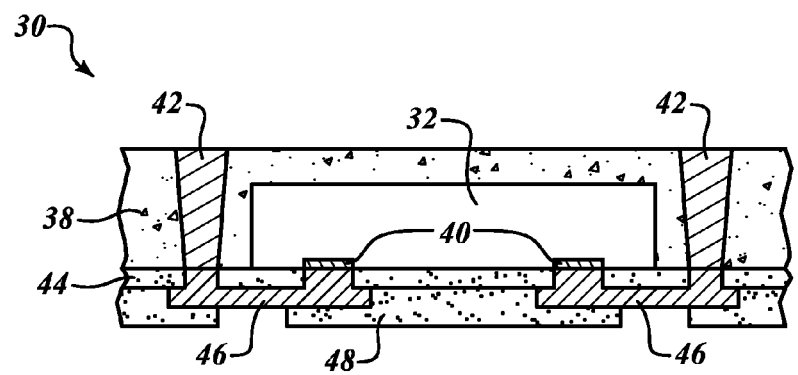
FIG. 1C illustrates the through via integrated circuit package of FIG. 1B with metal redistribution formed on the active side according to one embodiment.

In FIG. 1C, a passivation layer 44 is formed on the active side of the integrated circuit die 32 and the reconstituted substrate 38. The passivation layer 44 is patterned to expose the contact pads 40 of the integrated circuit die 32 as well as the through vias 42 of the reconstituted substrate 38. Metal redistribution lines 46 are formed on the passivation layer 44 and electrically connect the contact pads 40 to the through vias 42. A second passivation layer 48 is formed on the redistribution lines 46. The second passivation layer 48 is patterned to expose portions of the redistribution lines 46.

The passivation layer 44 is, for example, 7 μm thick. The passivation layer 44 is a spin-on dielectric material, in one embodiment. The spin-on dielectric 44 is placed on the surface of the integrated circuit die 32 and the reconstituted substrate 38 in liquid form. The integrated circuit package 30 is then subject to a spin-on process in which the integrated circuit 30 is rotated at very high RPS. This causes the dielectric 44, in liquid form still, to spread out and to achieve substantially uniform thickness over the integrated circuit package 32. The passivation layer 44 is then cured to harden the passivation layer 44. In one embodiment, the passivation layer 44 is spin-on glass. Any other suitable materials may be used for the passivation layer 44 including liquid and dry films.

The metal redistribution lines 46 are formed of copper about 7 μm thick. The metal redistribution lines 46 are formed by first depositing a seed layer of copper or tungsten by a physical vapor deposition process. The physical vapor deposition process is, for example, a sputtering process. The sputtering process produces a seed layer about 200 nm thick. The seed layer of copper or tungsten is then patterned and etched. An electroplating process is then performed in which copper is electroplated on the seed layer and grown to the thickness of about 7 μm. The electroplated copper is formed on the seed layer about 7 μm thick. This produces the redistribution lines 46 as shown in FIG. 1C. The redistribution lines 46 are in electrical contact with the contact pads 40 of the active side of the integrated circuit die 32. While two redistribution lines 46 and two contact pads 40 are shown in FIG. 1C, in practice there will be many more contact pads 40 on the active surface of the integrated circuit die 32, many more redistribution lines 46, and more through vias 42 than shown in FIG. 1C.

The second passivation layer 48 is about 9 μm thick. The passivation layer 48 is formed in substantially the same manner as passivation layer 44. The passivation layer 48 is patterned to expose portions of the redistribution lines 46.

Figure 1D:
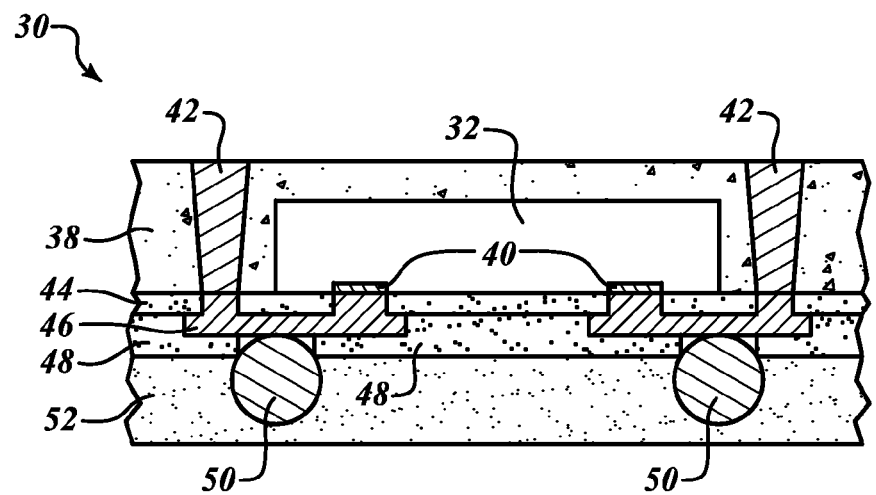
FIG. 1D illustrates the through via integrated circuit package of FIG. 1C with solder balls and molding compound formed on the active side of a die according to one embodiment.

In FIG. 1D, solder balls 50 are placed on the redistribution lines 46. The molding compound 52 covers the second passivation layer and the solder balls 50. Prior to putting on the solder balls 50, solder flux (not shown) can be placed on the exposed portions of the redistribution lines 46 if needed. The solder balls 50 are placed on the solder flux on the redistribution lines 46 and then solder reflow is performed. The active side of the integrated circuit package 30 is then covered in a molding compound 52.

The molding compound 52 is a conventional molding compound of a type typically used to encapsulate integrated circuit packages. The molding compound 52 can be an epoxy molding compound or any other suitable molding compound. The molding compound 52 covering the active side of the integrated circuit package 30 protects the active side of the integrated circuit package 30 during subsequent processing of the inactive side of the semiconductor package 30 as described further below. When metal redistribution lines are formed on the inactive side of the integrated circuit package 30, dielectric and metal layers will be deposited and patterned as will be described later herein. In conventional processes, during processing of the inactive side, a protective silicon substrate or other blocking substrate may be placed over the active side to protect the active side during processing of the inactive side. The acid etchants typically used to etch dielectric layers and metal layers on the inactive side of the integrated circuit package 30 can inadvertently seep between the protective silicon substrate and the reconstituted substrate 38 and into the metal layers and the dielectric layers on the active side of the integrated circuit package 30. If there is not adequate protection, the chemicals used to etch on the inactive side of the integrated circuit package 30 can corrode the redistribution lines 46 and even the contact pads 40 on the active side of the integrated circuit package.

Other processes for protecting the active side during inactive side processing include, prior to attaching solder balls 50, placing a protective polymer laminate on the active side to protect the active side while the inactive side is being processed. Such a protective polymer laminate is then removed when solder balls 50 are to be attached to the redistribution lines 46. The removal of this protective polymer laminate may leave residues on the active side after removal, if not done properly, and this can affect reliability of the integrated circuit package 30. If there are residues left on the redistribution lines 46, it is possible that very poor electrical contact will be made by the solder balls 50 to the redistribution lines 46. This can cause the integrated circuit package 30 to function improperly or not at all, therefore care should be taken to properly remove the residue.

Using a protective molding compound 52 according to one embodiment is advantageous compared to other processes. Placing the solder balls 50 on the redistribution lines 46 and covering the solder balls 50 and the active side of the integrated circuit package 30 with the molding compound 52 during processing of the inactive side provides superior protection during inactive side processing. This obviates the need for placing a protective polymer laminate or protective silicon substrate on the active side during processing of the inactive side. The molding compound 52 does not allow chemicals used during inactive processing to seep into the metal redistribution lines 46 during inactive side processing. Furthermore, the molding compound 52 is partially removed so no damaging residues are left on the active side components. Thus, placing the molding compound 52 on the active side, including on the solder balls 50, during inactive side processing is advantageous over using either a protective polymer laminate or a protective silicon substrate.

Figure 1E:
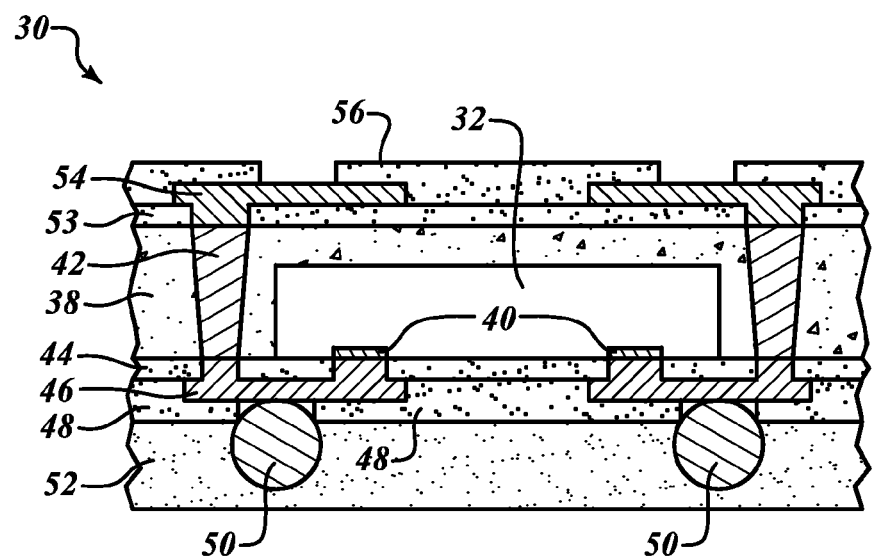
FIG. 1E illustrates the through via integrated circuit package of FIG. 1D with metal redistribution formed of the inactive side of the die according to one embodiment.

In FIG. 1E, passivation layer 53 is formed on the inactive side of the integrated circuit package 30. The passivation layer 53 is patterned to expose through vias 42. Inactive side metal redistribution lines 54 are formed on the exposed portions of the through vias 42 and on the passivation layer 53. A passivation layer 56 is then formed on the metal redistribution lines 54 and on the passivation layer 53. The passivation layer 56 is patterned to expose portions of the metal redistribution lines 54. The passivation layer 53, the metal redistribution lines 54, and the passivation layer 56 are formed of the same materials and in substantially the same manner as the passivation layers 44, 48 and redistribution lines 46 of the active side.

Figure 1F:
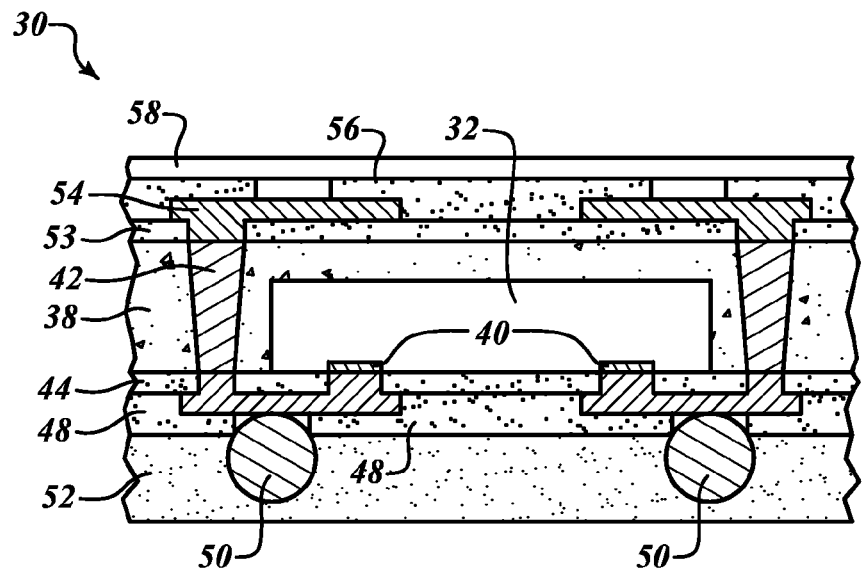
FIG. 1F illustrates the through via integrated circuit package of FIG. 1E with a protective substrate placed on the inactive side according to one embodiment.

In FIG. 1F, a protective substrate 58 is placed on the surface of the passivation layer 56 on the inactive side of the integrated circuit package 30. The protective substrate 58 protects components on the inactive side of the integrated circuit package during further processing of the active side of the integrated circuit package 30. The protective substrate 58 is, in one example, a protective silicon substrate as described previously. Any suitable protection can be used to protect the active side during further processing of the molding compound 52 on the active side.

Figure 1G:
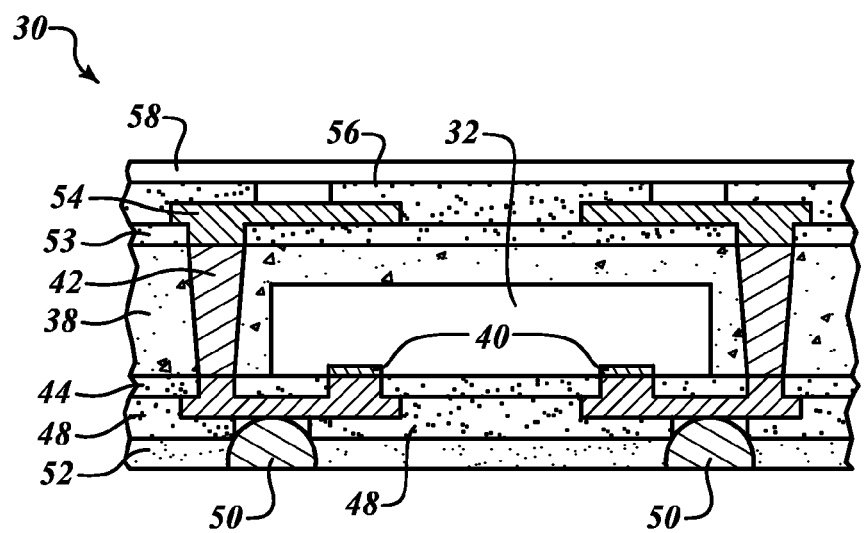
FIG. 1G illustrates the through via integrated circuit package of FIG. 1F with the molding compound and solder balls on the active side partially removed according to one embodiment.

In FIG. 1G, the molding compound 52 is partially removed to expose portions of the solder balls 50. The solder balls 50 are also partially removed. The thickness of the molding compound 52 is reduced by hundreds of microns. However, a portion of the molding compound 52 still remains. In one embodiment the molding compound 52 and solder balls 50 are partially removed by grinding the molding compound 52 and solder balls 50 in grinding process. CMC may also be used. About half of each solder ball 50 is ground away in the grinding process. This exposes a maximum surface area of the solder balls 50. During this grinding process, the inactive side of the integrated circuit package 30 is protected by the protective layer 58.

Figure 1H:
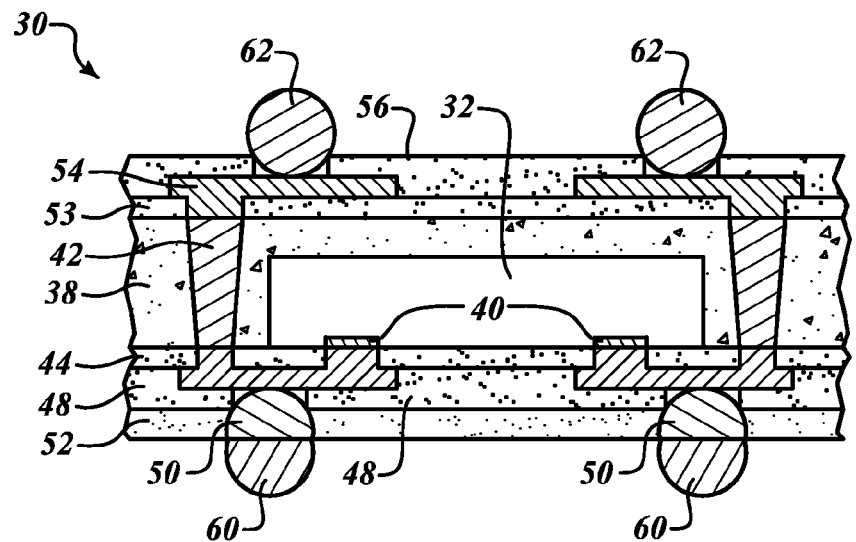
FIG. 1H illustrates the through via integrated circuit package of FIG. 1G with additional solder balls placed on the partially removed solder balls and also on the inactive side according to one embodiment.

In FIG. 1H, solder balls 60 are placed on the exposed portions of the solder balls 50. Because a large portion of the solder balls 50 is exposed, solder balls 60 can be electrically connection to the solder balls 50. The solder balls 50 are in electrical connection with the redistribution lines 46. The redistribution lines 46 are in electrical connection with the through vias 42. The through vias 42 are in electrical contact with inactive side metal redistribution lines 54. Thus the inactive side redistribution lines are electrically connected to the active side solder balls 60.

Solder balls 62 are placed on the inactive side redistribution lines 54. The protective silicon substrate 58 is removed from the inactive side of the integrated circuit package so that further processing of the inactive side of the integrated circuit package 30 can occur.

The integrated circuit package 30 of FIG. 1H has increased reliability over other integrated circuit packages which are formed by protecting the active side with a protective polymer laminate or protective silicon substrate during inactive side processing. Chemicals do not seep through the molding compound 52 and deteriorate active side structures. No protective polymer laminate is removed and therefore no harmful residues are left on structures of the active side. Thus, reliability of the integrated circuit package 30 is increased. The through via integrated circuit package 30 of FIG. 1H can be connected to other circuits, a circuit board, or other devices both on the active side of the integrated circuit package 30 and the inactive side of the integrated circuit package 30. While solder balls 62 are shown as being placed on the inactive side of the integrated circuit package 30, in other applications, the metal redistribution lines 54 are exposed for connection directly to a test board. The test board includes metal connection structures which can connect to the redistribution lines 54 to test the functionality of the integrated circuit package 30. The connection structures of the test board may include solder balls, pins of a pin grid array, or any other suitable electrical connections. While the integrated circuit package 30 as illustrated in FIG. 1H shows solder balls 60 as being electrically connected to solder balls 62, in practice not all solder balls 60 that are placed on the active side of the integrated circuit package 30 will be electrically connected to metal redistribution lines 54 of the inactive side of the integrated circuit package 30. Some contact pads 40 on the active side of the integrated circuit die 32 will only be connected to solder balls 62 or electrical connections placed on the inactive side of the integrated circuit die 32. Other contact pads 40 will be connected only to solder balls 60 on the active side of the integrated circuit package 30. Many configurations of solder balls 60, active side redistribution lines 46, contact pads 40, through vias 42, inactive side redistribution lines 54, and solder balls 62 are possible in accordance with principles of the present disclosure. All such configurations fall within the scope of the present disclosure.

Figure 2A:
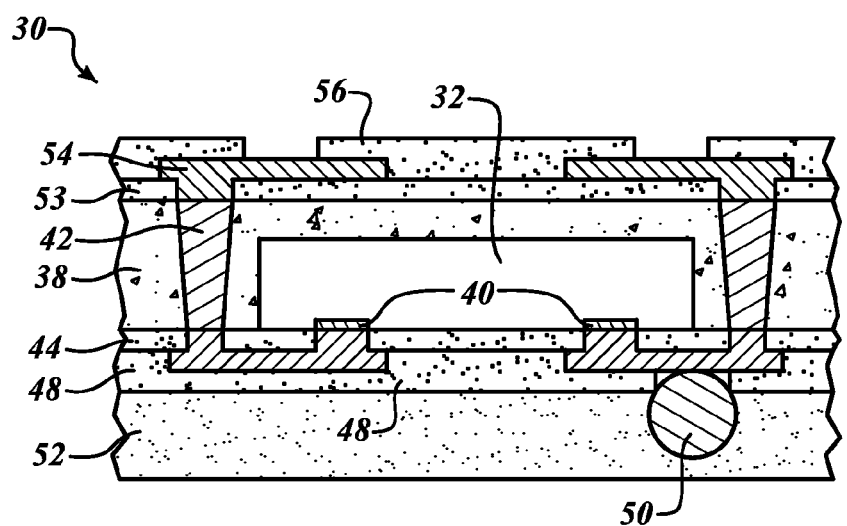
FIG. 2A illustrates a through via integrated circuit package at an intermediate stage of processing according to one embodiment according to one embodiment.
Figure 2B:
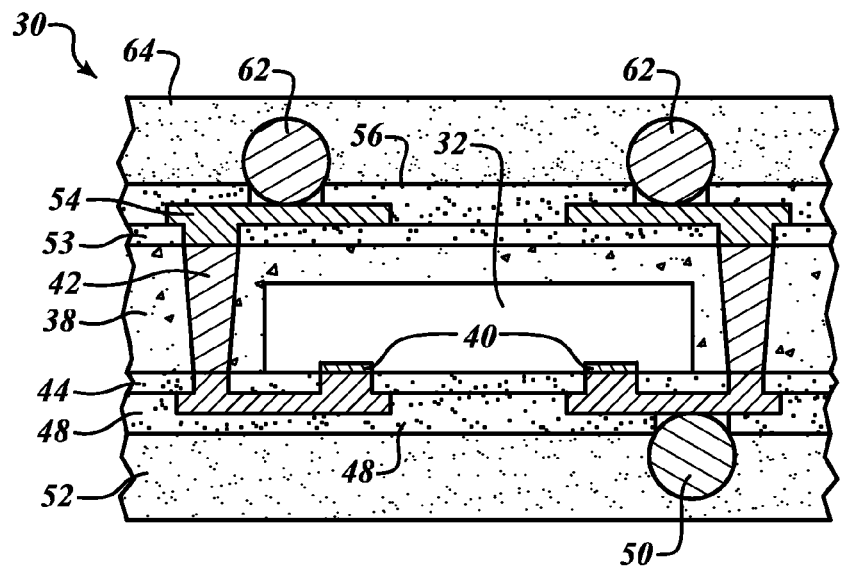
FIG. 2B illustrates the through via integrated circuit package of FIG. 2A including solder balls and molding compound on the inactive side according to one embodiment according to one embodiment.

FIG. 2A illustrates a semiconductor package 30 according to one embodiment. The semiconductor package 30 of FIG. 2A is at the same point in processing as the semiconductor package 30 shown in FIG. 1E. Note that in the embodiment of FIG. 2A, one of the contacts 40 is not coupled to a solder ball 50 on the active side to show how this is done in any of the embodiments. Active side metal redistribution lines 46 have already been formed, solder ball 50 has already been placed, and molding compound 52 coats the solder ball 50 and the rest of the active side. Metal redistribution lines 54 are formed in patterns on the inactive side as well as passivation layers 53 and 56. In FIG. 2B, solder balls 62 are placed on the redistribution lines 54. Prior to placement of the solder balls 62 on the metal redistribution lines 54, flux is placed on the metal redistribution lines 54. Solder balls 62 are then placed on the flux on the metal redistribution lines 54 and reflow is performed. Molding compound 64 is then deposited on the inactive side covering the solder balls 62. The molding compound 64 is substantially identical to the molding compound 52 covering the active side. The molding compound 64 serves the same purpose as the molding compound 52 on the active side. Namely, the molding compound 64 protects the metal redistribution lines 54 and the passivation layers 56 and 53 on the inactive side of the integrated circuit package 30 during further processing steps of the active side of the integrated circuit package 30.

Figure 2C:
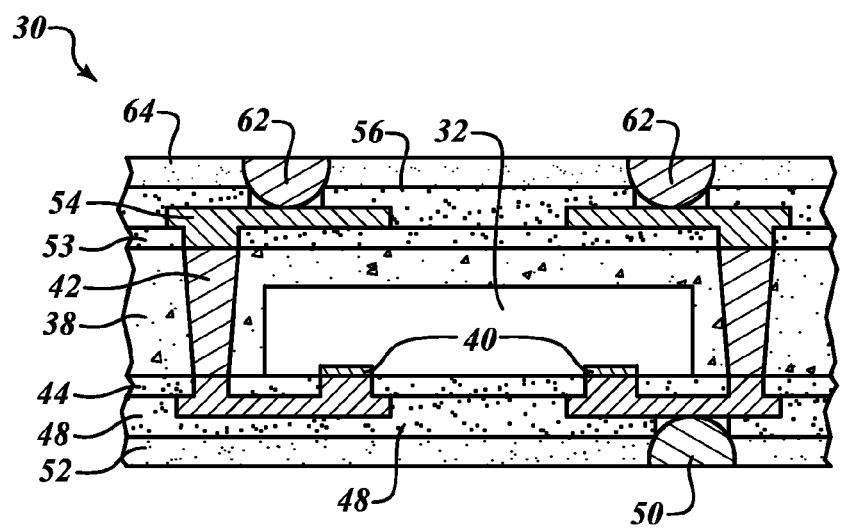
FIG. 2C illustrates the through via integrated circuit package of FIG. 2B with the molding compound and solder balls on each side being ground according to one embodiment.

In FIG. 2C, the molding compound 52 and the solder balls 50 are ground, as described previously. The molding compound 64 and the solder balls 62 on the inactive side have also been ground. The grinding of the molding compound 64 and the exposure of the remaining portions of solder balls 62 are done in substantially the same manner as described previously regarding the molding compound 52 on the active side of the integrated circuit package 30. Because the inactive side of the integrated circuit package 30 is covered in molding compound 34, the inactive side of the integrated circuit package 30 is protected during grinding of the molding compound 52 on the active side of the integrated circuit package 30. During grinding it is possible that structures on the inactive side of the integrated circuit package 30 can be damaged in the absence of molding compound 64. Other processes for removing a portion of the molding compound 52 and the solder balls 50 are also possible. Such processes may include polishing, CMP, chemically etching the molding compound 52 and the solder balls 50 or other suitable processes. These processes may damage the metal redistribution lines 54 on the inactive side if the inactive side is not adequately protected. Because the molding compound 64 covers the inactive side of the integrated circuit package 30, the inactive side is protected from the processes performed on the active side. Likewise, the molding compound 52 protects the active side from processes performed on the inactive side of the integrated circuit package as described previously.

Figure 2D:
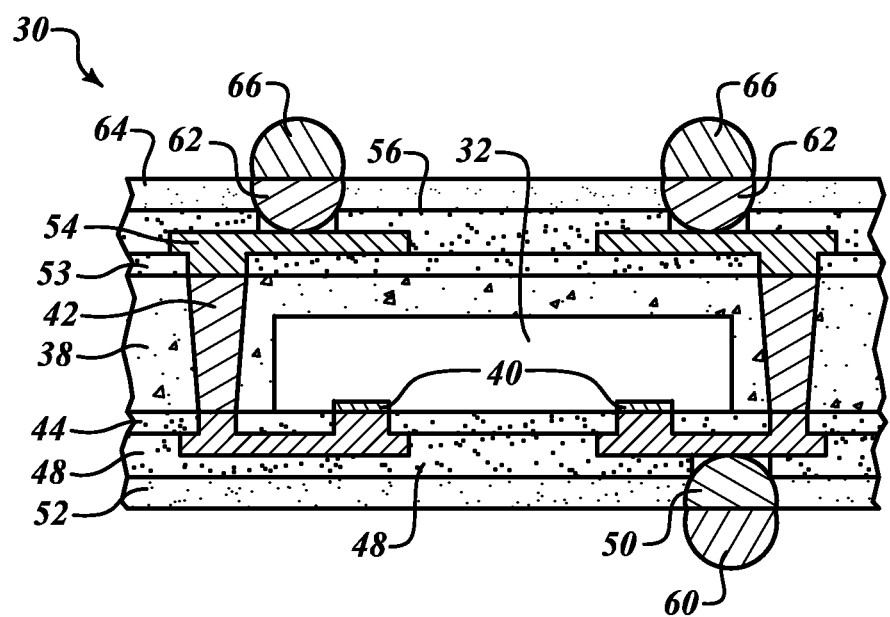
FIG. 2D illustrates the through via integrated circuit package of FIG. 2C including additional solder balls on the active side and the inactive side according to one embodiment.

In FIG. 2D, solder balls 60 are placed on exposed portions of solder balls 50. Solder balls 66 are also placed on exposed portions of solder balls 62. The integrated circuit package 30 of FIG. 2D may now be connected in any suitable system. Electrical components can be connected to solder balls 66 of the inactive side of the integrated circuit package 30; other electrical devices may be connected to solder balls 60 of the integrated circuit package. Thus connections can be made on both the active side of the integrated circuit package 30 and the inactive side of the integrated circuit package 30.

In one embodiment, solder balls 66 are not placed on the exposed portions of solder balls 62, but rather another integrated circuit package, test board, or other device having solder balls or other electrical connections can be placed directly on the exposed portions of the solder balls 62. In one embodiment, the solder balls 60 likewise are not placed on the solder balls 50. Instead, electrical connections on a device that will be connected to the active side of the integrated circuit package 30 can be directly connected to the exposed portions of the solder balls 50. Many other configurations not shown in the figures are also possible in accordance with principles of the present disclosure. All such configurations fall within the scope of the present disclosure.

In one embodiment, solder balls 50 and solder balls 62 are not solder balls but are other solder structures such as solder columns or blocks. Any suitable solder structures or other electrical connections can be used to connect to the metal redistribution lines 54. While the figures have shown an integrated circuit die 32 in the reconstituted substrate 38, other configurations are also possible. Many other types of through via configurations are possible, for example through vias may be formed in the integrated circuit die 32. Molding compound may then be used to cover metal redistribution lines on the active side of the integrated circuit die 32 while redistribution lines are formed on the inactive side of the integrated circuit die 32. In one embodiment, a single integrated circuit package 30 includes two integrated circuit dies stacked on top of each other. Many other structures and combinations of structures are possible and can be used in accordance with the principles of the present disclosure. All such other combinations and possibilities fall within the scope of the present disclosure.

Figure 3:
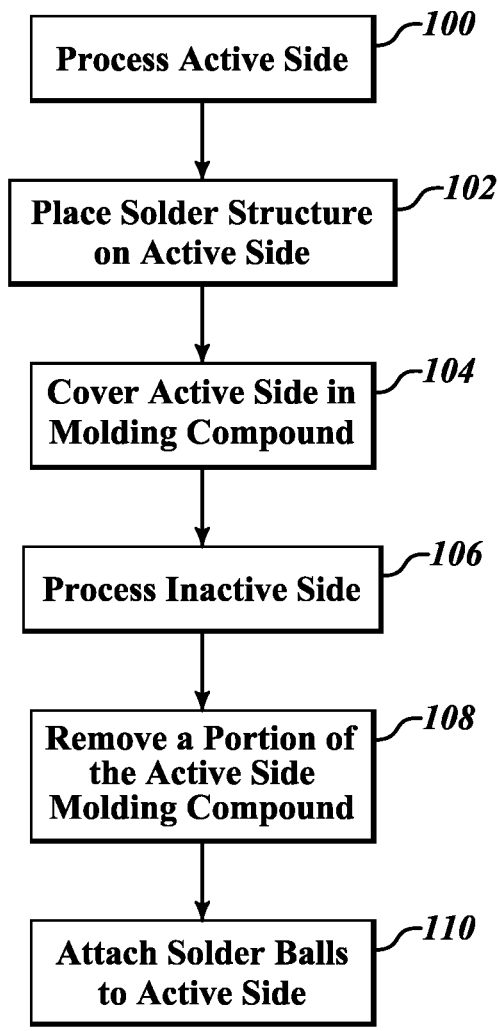
FIG. 3 illustrates a method for forming an integrated circuit package according to one embodiment.

FIG. 3 illustrates a method for forming an integrated circuit package 30 according to one embodiment. The integrated circuit package 30 includes an integrated circuit die 32 having an active side on which contact pads are formed as well as an inactive side opposite the active side. At 100, the active side of the integrated circuit die is processed to form metal redistribution lines 46 as described previously. Passivation layers 44 and 48 are formed above and below the redistribution lines 46. The passivation layers 44 and 48 are patterned to allow the redistribution lines 46 to make electrical contact to the contact pads 40 and to expose the metal interconnections 46 to contact to further conductive structures.

At 102, solder structures 50 are placed on the exposed portions of the metal interconnections 46 of the active side of the integrated circuit die 32. At 104, the active side of the integrated circuit die 32 is covered in molding compound. The molding compound 52 covers the redistribution lines 46 and the passivation layers 44 and 48 of the active side of the integrated circuit die 32. The molding compound 52 also covers the solder balls 50 which are placed on the active side.

At 106, the inactive side of the integrated circuit die is also processed to form inactive side redistribution lines 54. Passivation layers 53 and 56 are formed above and below the redistribution lines 54. The passivation layers 53 and 56 are patterned to allow electrical connection to the redistribution lines 54. Because the active side is covered in the molding compound 52 while the redistribution lines and the passivation layers of the inactive side are being processed, the structures on the active side of the integrated circuit die 32 are protected. As described previously, in the absence of the molding compound 52, chemicals used to etch the redistribution lines 54 and passivation layers 53 and 56 can seep into the structures on the active side of the integrated circuit die 32 and damage them. The molding compound 52 thus protects the active side of the integrated circuit die 32 during processing of the inactive side of the integrated circuit die 32.

At 108, the molding compound 52 on the active side of the integrated circuit die 32 is partially removed to expose portions of the solder balls 50. The molding compound 52 can be partially removed by grinding the molding compound 52 or by etching the molding compound 52 or by any other suitable procedure. At 110, solder balls are placed on the exposed portions of the solder balls 50 and the redistribution lines 54. The integrated circuit package 30 can now be connected to devices on the active side and the inactive side thereof.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a first conductive redistribution line overlying an active side of an integrated circuit die;
   forming a through via from the active side of the integrated circuit die to an inactive side of the integrated circuit die, the through via being electrically connected to the first conductive redistribution line;
   placing a first solder ball on the first conductive redistribution line;
   placing a first encapsulation layer on the first solder ball;
   forming, after placing the first encapsulation layer, a second conductive redistribution line overlying the inactive side of the integrated circuit die in electrical contact with the through via;
   removing a portion of the encapsulation layer; and
   placing a second solder ball on the first solder ball.

2. The method of claim 1 wherein removing a portion of the insulating material comprises grinding the insulating material and the first solder ball.

3. The method of claim 1 wherein forming the second conductive redistribution line comprises:
   depositing a metal layer on the inactive side; and
   etching the metal layer to form the second conductive redistribution line, prior to removing the portion of the insulating material.

4. The method of claim 1, comprising placing a third solder ball on the second conductive redistribution line.

5. The method of claim 4, comprising covering the third solder ball in a second encapsulation layer.

6. The method of claim 5, comprising removing a portion of the second encapsulation layer and the third solder ball.

7. The method of claim 6, comprising placing a fourth solder ball on the third solder ball.

8. The method of claim 1, comprising:
   placing the integrated circuit die in a reconstituted substrate; and
   forming the through via in the reconstituted substrate.

9. The method of claim 1 wherein:
   forming the first redistribution line includes forming a plurality of first redistribution lines overlying the active side of the integrated circuit die;
   forming the second redistribution line includes forming a plurality of second redistribution lines overlying the inactive side of the integrated circuit die; and
   forming the through via includes forming a plurality of through vias each electrically connecting a respective one of the plurality of first redistribution lines to a respective one of the plurality of second redistribution lines.

10. A method, comprising:
    forming first metal contacts overlying an active side of an integrated circuit die;
    covering the active side of the integrated circuit die in a first encapsulation layer; and
    forming second metal contacts overlying an inactive side of the integrated circuit die while the active side of the die is covered in the first encapsulation layer.

11. The method of claim 10, comprising placing first solder balls on the first integrated circuit die prior to covering the active side in the first encapsulation layer.

12. The method of claim 11, comprising:
    removing a portion of the first encapsulation layer and the first solder balls; and
    placing second solder balls on the first solder balls after the portion of the first solder balls is removed.

13. The method of claim 12, comprising placing third solder balls on the second metal contacts.

* * * * *